(12) United States Patent
Gao et al.

(10) Patent No.: US 11,816,920 B2
(45) Date of Patent: Nov. 14, 2023

(54) FINGERPRINT IDENTIFICATION APPARATUS AND ELECTRONIC DEVICE

(71) Applicant: SHENZHEN GOODIX TECHNOLOGY CO., LTD., Guangdong (CN)

(72) Inventors: Pan Gao, Guangdong (CN); Baoquan Wu, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/074,686

(22) Filed: Dec. 5, 2022

(65) Prior Publication Data
US 2023/0093839 A1 Mar. 30, 2023

Related U.S. Application Data

(63) Continuation of application No. PCT/CN2021/083430, filed on Mar. 26, 2021.

(51) Int. Cl.
*G06V 40/13* (2022.01)
*H04N 25/20* (2023.01)
*H01L 27/146* (2006.01)

(52) U.S. Cl.
CPC .... *G06V 40/1318* (2022.01); *H01L 27/14621* (2013.01); *H01L 27/14623* (2013.01);
(Continued)

(58) Field of Classification Search
CPC .......... G06V 40/1318; H01L 27/14621; H01L 27/14623; H01L 27/14627;
(Continued)

(56) References Cited

U.S. PATENT DOCUMENTS

2009/0104545 A1 4/2009 Chen et al.
2018/0012069 A1* 1/2018 Chung ............... G06V 40/1394
(Continued)

FOREIGN PATENT DOCUMENTS

CN 104730756 A 6/2015
CN 104749674 A 7/2015
(Continued)

OTHER PUBLICATIONS

International Search Report dated Dec. 30, 2021 issued in PCT/CN2021/083430.

*Primary Examiner* — Premal R Patel
(74) *Attorney, Agent, or Firm* — Scully, Scott, Murphy & Presser, P.C.

(57) ABSTRACT

Embodiments of the present application disclose a fingerprint identification apparatus and an electronic device, which can simplify an optical path laminated structure and processing process, thereby improving efficiency of mass production. The fingerprint identification apparatus includes: a fingerprint sensor chip; an infrared radiation cut filter layer provided above the fingerprint sensor chip; a light blocking layer provided on an upper surface of the infrared radiation cut filter layer by means of coating film, the light blocking layer being provided with a first hole array, and cross sections of holes in the first hole array being inverse trapezoid; a light transmitting dielectric layer including first color filter units, the first color filter units being formed in part of the holes in the first hole array to cover the part of the holes; and a microlens array provided above the light transmitting dielectric layer.

20 Claims, 5 Drawing Sheets

(52) U.S. Cl.
CPC .. *H01L 27/14627* (2013.01); *H01L 27/14678* (2013.01); *H01L 27/14685* (2013.01); *H04N 25/20* (2023.01)

(58) Field of Classification Search
CPC ........ H01L 27/14678; H01L 27/14685; H04N 25/20; G02B 3/0012; G02B 5/208; G02B 3/0006; G02B 6/0055
See application file for complete search history.

(56) References Cited

U.S. PATENT DOCUMENTS

| | | | |
|---|---|---|---|
| 2019/0019000 A1* | 1/2019 | Lee | G02B 5/204 |
| 2020/0035729 A1 | 1/2020 | Lee et al. | |
| 2022/0050990 A1* | 2/2022 | Chu | G06V 40/1318 |

FOREIGN PATENT DOCUMENTS

| | | | |
|---|---|---|---|
| CN | 105339835 | A | 2/2016 |
| CN | 111488830 | A | 8/2020 |
| CN | 111598068 | A | 8/2020 |
| CN | 111599846 | A | 8/2020 |
| CN | 111697039 | A | 9/2020 |
| CN | 211427367 | U | 9/2020 |
| CN | 111837132 | A | 10/2020 |
| CN | 211742126 | U | 10/2020 |
| CN | 112379794 | A | 2/2021 |
| CN | 112418093 | A | 2/2021 |
| CN | 112466896 | A | 3/2021 |
| DE | 112012006725 | T5 | 4/2015 |
| JP | 2003084123 | A | 3/2003 |
| KR | 20200042810 | A | 4/2020 |

* cited by examiner

FINGERPRINT IDENTIFICATION APPARATUS AND ELECTRONIC DEVICE

CROSS-REFERENCE TO RELATED APPLICATIONS

This application is a continuation of International Application No. PCT/CN2021/083430, filed on Mar. 26, 2021, the disclosure of which is hereby incorporated by reference in its entirety.

TECHNICAL FIELD

Embodiments of the present application relate to the field of fingerprint identification, and more particularly, to a fingerprint identification apparatus and an electronic device.

BACKGROUND

With the advent of an era of a full screen mobile phone, the application of under-display fingerprint is more and more widespread, among which an optical under-display fingerprint is most popular.

Generally, an optical fingerprint identification apparatus includes a fingerprint sensor chip, an infrared radiation cut filter layer, a light blocking layer, a color filter layer and a microlens array layer from bottom to top in sequence. The existing optical fingerprint identification apparatus needs to use a transparent dielectric layer as an adhesion buffer layer between the infrared radiation cut filter layer and the light blocking layer, and use the transparent dielectric layer as a flat buffer layer between the light blocking layer and the color filter layer and between the color filter layer and the microlens array layer, such that an optical path structure is relatively complex, processing process is cumbersome, and output efficiency is relatively low in general.

SUMMARY

Embodiments of the present application provide a fingerprint identification apparatus and an electronic device, which can simplify an optical path laminated structure and processing process, thereby improving efficiency of mass production.

In a first aspect, there is provided a fingerprint identification apparatus, which is applicable to an electronic device with a display screen, and the fingerprint identification apparatus is configured to be provided under the display screen. The fingerprint identification apparatus includes: a fingerprint sensor chip; an infrared radiation cut filter layer provided above the fingerprint sensor chip; a light blocking layer provided on an upper surface of the infrared radiation cut filter layer by means of coating film, the light blocking layer being provided with a first hole array, and cross sections of first holes in the first hole array being inverse trapezoid; a light transmitting dielectric layer including first color filter units, the first color filter units being formed in part of the first holes in the first hole array to cover the part of the first holes, and the first color filter units being configured to transmit light of at least one waveband among red light, blue light and green light; a microlens array provided above the light transmitting dielectric layer; where the fingerprint sensor chip is configured to receive an optical signal returned by a finger above the display screen, converged by the microlens array, and then guided by the first hole array, and the optical signal is configured to perform fingerprint identification.

The light blocking layer is made by means of coating film, such that the hole of the light blocking layer may be in an inverse trapezoid shape, the color filter unit may be directly provided above the light blocking layer, which reduces the number of transparent dielectric layers between the light blocking layer and a color filter layer, greatly simplifies an optical path laminated structure and processing process, and improves efficiency of mass production in the case that an effect of fingerprint identification is not affected.

In addition, the light blocking layer is not made by means of coating BM photoresist, but by means of coating film. By matching a film layer thickness and a structure of a specific type of a material, an optical effect equivalent to that of the BM photoresist can be achieved. To a certain extent, it can enrich selection of materials and broaden ways of preparation, which is conducive to development and application of the fingerprint identification apparatus, and can alleviate a bottleneck of capacity.

In a possible implementation manner, the first color filter units are formed in the part of the first holes by an organic color resist material after coating and patterning by exposure and development.

In a possible implementation manner, the first color filter units are formed in the part of the first holes by an inorganic material after coating film and patterning by means of a lift-off process.

In a possible implementation manner, the first color filter units are made of at least one material among silicon dioxide, titanium dioxide or niobium pentoxide.

For example, the first color filter units may adopt silicon dioxide, titanium dioxide or niobium pentoxide.

In a possible implementation manner, a thickness of the first color filter units is 0.5-3 μm.

In a possible implementation manner, the infrared radiation cut filter layer is a coating film layer formed on an upper surface of the fingerprint sensor chip.

In a possible implementation manner, the light transmitting dielectric layer further includes second color filter units or a first transparent dielectric layer, the second color filter units or the first transparent dielectric layer is formed in another part of the first holes other than the part of the first holes in the first hole array to cover the another part of the first holes, and the second color filter units are configured to transmit light of a different color from the first color filter unit.

In a possible implementation manner, the fingerprint identification apparatus further includes: a second transparent dielectric layer provided on an upper surface of the light transmitting dielectric layer; where the microlens array is provided on an upper surface of the second transparent dielectric layer.

The light blocking layer is made by means of coating film, such that the hole of the light blocking layer may be in the inverse trapezoid shape, the color filter layer unit may be provided above the light blocking layer, thus the entire optical path structure only needs to provide a transparent dielectric layer between the light transmitting dielectric layer and the microlens array, that is, adhesion, molding and protection between the infrared radiation cut filter layer, the light blocking layer, the color filter unit and the microlens array may be implemented, which reduces the number of transparent dielectric layers, greatly simplifies the optical path laminated structure and processing process, and improves the efficiency of mass production in the case that the effect of fingerprint identification is not affected.

Optionally, the second color filter units are configured to transmit light of a different color from the first color filter unit, for example, the first color filter units are configured to transmit the red light, and the second color filter units are configured to transmit the green light.

By providing the second color filter unit, it is conducive to reducing an effect of an ambient optical signal, such that performance of fingerprint identification may be improved.

Optionally, the second color filter units and the first color filter units may be formed in a similar manner. For example, the second color filter units adopt the organic color resist material, and is formed in the another part of first holes after coating and patterning by exposure and development. For another example, the second color filter units adopt the inorganic material, and is formed in the another part of first holes after coating film and patterning by the lift-off process.

Optionally, a thickness of the second color filter units or the first transparent dielectric layer may be the same as the thickness of the first color filter units, for example, may be 0.5-3 µm.

Optionally, the second color filter units are made of at least one of silicon dioxide, titanium dioxide or niobium pentoxide.

Optionally, a material adopted by the second color filter units and the first color filter units may be the same or different.

In a possible implementation manner, the fingerprint sensor chip includes a pixel array having a plurality of pixel units, the plurality of pixel units includes effective pixel units of a photosensitive area and dark pixel units of a dark pixel area, and the dark pixel area surrounds the photosensitive area, where the light transmitting dielectric layer includes a plurality of first color filter units provided above the effective pixel units of at least one circle at an outermost periphery of the photosensitive area and a plurality of first color filter units in a grid shape provided above the dark pixel units, and the plurality of first color filter units provided above the dark pixel units are connected to the plurality of first color filter units provided above the effective pixel units.

In a possible implementation manner, the plurality of first color filter units provided above the effective pixel units are discretely distributed.

In a possible implementation manner, the plurality of first color filter units provided above the effective pixel units are continuously distributed.

Optionally, the second color filter units may be provided above the effective pixel units other than the effective pixel units of at least one circle at the outermost periphery in a sensing area.

In a possible implementation manner, the fingerprint sensor chip includes a pixel array having a plurality of pixel units and a metal pattern layer, the metal pattern layer is provided above the pixel array, the metal pattern layer is provided with a second hole array, and a second hole in the second hole array corresponds to a pixel unit in the pixel array one-to-one, where the pixel array is configured to receive the optical signal returned by the finger above the display screen, converged by the microlens array, and then guided by the first hole array and the second hole array.

In a possible implementation manner, reflectance and transmittance of a non-opening area of the light blocking layer to an optical signal in a waveband of 400 nm~1200 nm are less than 0.1%.

In a possible implementation manner, a first hole array in the light blocking layer is formed by an etching or lift-off process after exposure and development.

In a possible implementation manner, transmittance of the first transparent dielectric layer and/or the second transparent dielectric layer to an optical signal in a visible light waveband is greater than 98%.

In a possible implementation manner, the first transparent dielectric layer and/or the second transparent dielectric layer are provided by means of the coating or coating film.

In a possible implementation manner, the first transparent dielectric layer and/or the second transparent dielectric layer is made of at least one material among silicon nitride, silicon dioxide and silicon oxynitride.

For example, the first transparent dielectric layer and/or the second transparent dielectric layer may adopt silicon nitride, silicon dioxide or silicon oxynitride.

Optionally, the first transparent dielectric layer and the second transparent dielectric layer may be the same transparent dielectric layer.

In a second aspect, there is provided an electronic device, including a display screen, and the fingerprint identification apparatus according to the first aspect and any one of possible implementation manners of the first aspect.

In a third aspect, there is provided a method of preparing a fingerprint identification apparatus is, including: making an infrared radiation cut filter layer on an upper surface of a fingerprint sensor chip by means of coating film; performing coating film on an upper surface of the infrared radiation cut filter layer, and performing patterning by a lift-off process to form a light blocking layer having a first hole array, and cross sections of first holes in the first hole array being inverse trapezoid; making first color filter units in part of the first holes in the first hole array, and the first color filter units being configured to transmit light of at least one waveband among red light, blue light and green light.

The light blocking layer is made by means of coating film, such that the hole of the light blocking layer may be in the inverse trapezoid shape, the color filter layer may be directly provided above the light blocking layer, which reduces the number of transparent dielectric layers between the light blocking layer and the color filter layer, greatly simplifies the optical path laminated structure and processing process, and improves the efficiency of mass production in the case that the effect of fingerprint identification is not affected.

In a possible implementation manner, the making the first color filter unit in the part of the first holes in the first hole array includes: adopting an organic color resist material to perform coating an upper surface of the light blocking layer and in the first hole array; performing the patterning by exposure and development, such that the organic color resist material covers the part of the first holes in the first hole array to form the first color filter units.

In a possible implementation manner, the making the first color filter unit in the part of the first holes in the first hole array includes: adopting an inorganic material to perform the coating on the upper surface of the light blocking layer and in the first hole array; performing the patterning by the lift-off process, such that the organic color resist material covers the part of the first holes in the first hole array to form the first color filter unit.

In a possible implementation manner, the method further includes making second color filter units or a first transparent dielectric layer in another part of the first holes other than the part of the first holes in the first hole array, the second color filter units being configured to transmit light of a different color from the first color filter units, and the first color filter units and the second color filter units forming a light transmitting dielectric layer or the first color filter unit and the first transparent dielectric layer forming a light transmitting dielectric layer.

In a possible implementation manner, the first color filter units are configured to transmit the red light, and the second color filter units are configured to transmit the green light.

In a possible implementation manner, the method further includes making a second transparent dielectric layer on an upper surface of the light transmitting dielectric layer; making a microlens array on an upper surface of the second transparent dielectric layer.

DESCRIPTION OF EMBODIMENTS

The following describes technical solutions of the present application with reference to accompanying drawings.

With the development of the times and advancement of science and technology, a screen ratio of an electronic product screen is getting higher and higher, and a full screen has become a development trend of many electronic products. In order to adapt to the development trend of the full screen, photosensitive devices in the electronic product, such as fingerprint identification, front camera, or the like, will also be placed under the screen. The most widely used under-display fingerprint identification technology is an under-display optical fingerprint identification technology. Due to particularity of under-display optical fingerprint devices, it is required that light with a fingerprint signal can pass through the screen to a fingerprint sensor below, thereby acquiring the fingerprint signal.

It should be understood that embodiments of the present application may be applied to an optical fingerprint system, including but not limited to an optical fingerprint identification system and a medical diagnostic product based on optical fingerprint imaging. The embodiments of the present application are merely described by taking the optical fingerprint system as an example, which should not constitute any limitation to the embodiments of the present application, and the embodiments of the present application are also applicable to other systems using an optical imaging technology or the like.

As a common application scenario, an optical fingerprint system provided in the embodiments of the present application may be applied to portable or mobile computing devices such as smartphones, tablet computers, and game devices, as well as electronic databases, automobiles, bank automated teller machines (ATM), and other electronic devices, but the embodiments of the present application are not limited thereto. The embodiments of the present application may be applied to other mobile terminals or other electronic devices having display screens; more specifically, in the above electronic devices, a fingerprint identification apparatus may specifically be an optical fingerprint apparatus, which may be provided in a partial area or all areas under a display screen, thereby forming an under-display optical fingerprint system.

Figure 1:
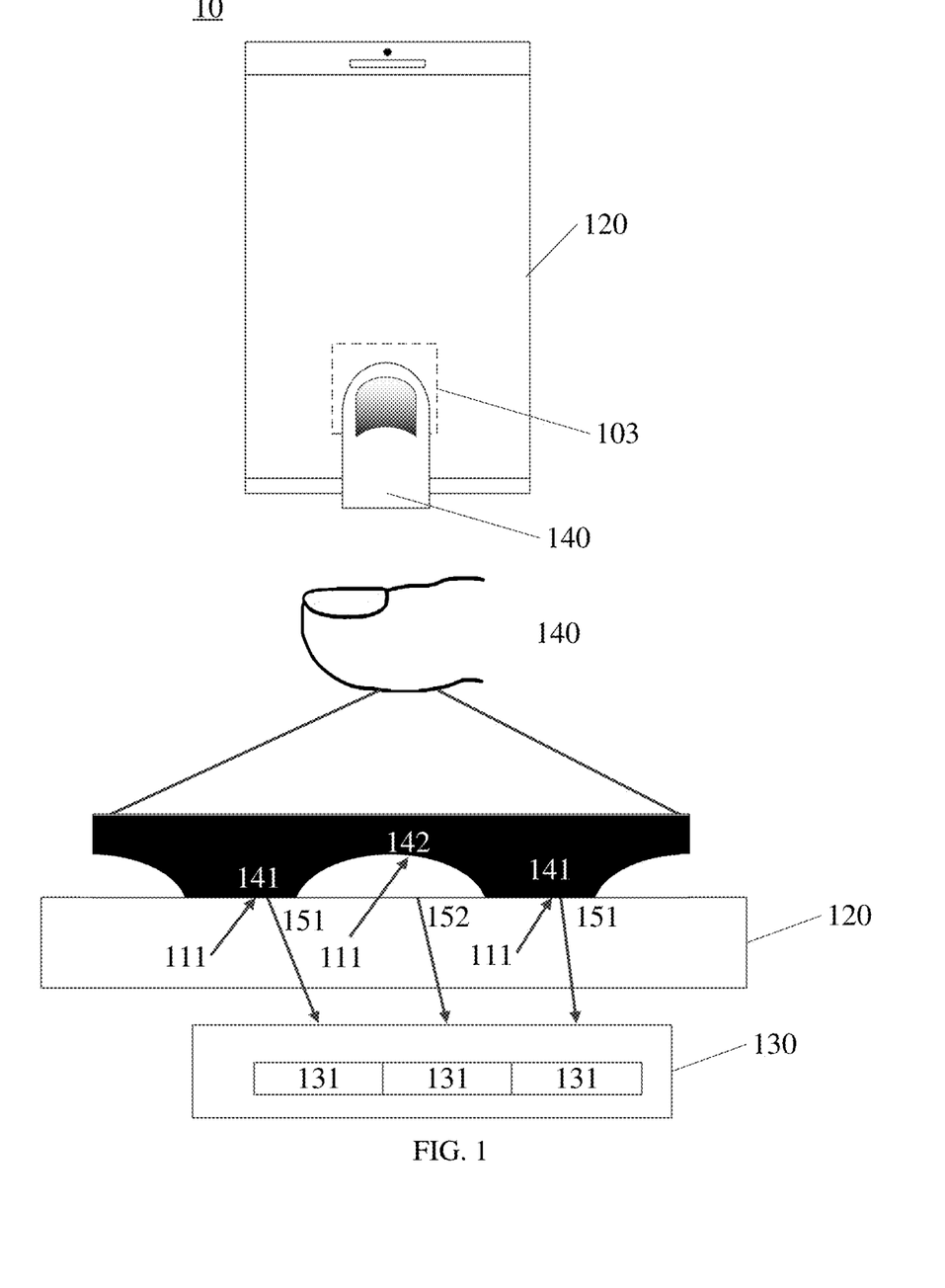
FIG. 1 is a structural diagram of an electronic device used in an embodiment of the present application.

FIG. 1 shows a structural diagram of an electronic device to which an embodiment of the present application is applicable. The electronic device 10 includes a display screen 120 and an optical fingerprint apparatus 130, where the optical fingerprint apparatus 130 is provided in a partial area under the display screen 120. The optical fingerprint apparatus 130 includes an optical fingerprint sensor including a pixel array having a plurality of optical pixel units 131, and an area where the pixel array is located or a sensing region thereof is a fingerprint detection area 103 of the optical fingerprint apparatus 130. As shown in FIG. 1, the fingerprint detection area 103 is located within a display area of the display screen 120. In an alternative embodiment, the optical fingerprint apparatus 130 may also be provided at other positions, such as a side face of the display screen 120 or an edge non light transmitting area of the electronic device 10, and an optical signal of at least part of the display area of the display screen 120 is directed to the optical fingerprint apparatus 130 through an optical path design, such that the fingerprint detection area 103 is actually located in the display area of the display screen 120.

It should be understood that an area of the fingerprint detection area 103 may be different from an area of a pixel array of the optical fingerprint apparatus 130. For example, the area of the fingerprint detection area 103 of the optical fingerprint apparatus 130 may be larger than the area of the pixel array of the optical fingerprint apparatus 130 by a lens imaging optical path design, a reflective folding optical path design, or other optical path designs such as light convergence or reflection. In other alternative implementation manners, if the optical path is directed in a manner of, for example, light collimation, the area of the fingerprint detection area 103 of the optical fingerprint apparatus 130 may also be designed to be substantially identical with the area of the pixel array of the optical fingerprint apparatus 130.

Therefore, when a user needs to unlock the electronic device or perform other fingerprint verifications, a fingerprint input can be implemented merely by pressing a finger on the fingerprint detection area 103 in the display screen 120. Since fingerprint detection may be implemented in the screen, there is no need to exclusively reserve space for a front surface of the electronic device 10 adopting the foregoing structure to set a fingerprint button (such as a Home button), such that a full screen solution may be adopted; that is, the display area of the display screen 120 may be substantially extended to an entire front surface of the electronic device 10.

As an optional embodiment, the display screen 120 may adopt a display screen with a self-emitting display unit, such as an organic light-emitting diode (OLED) display screen or a micro light-emitting diode (Micro-LED) display screen. In an example of the OLED display screen, the optical fingerprint apparatus 130 may use a display unit (that is, an OLED light source) located in the fingerprint detection area 103 of the OLED display screen 120 as an excitation light source for optical fingerprint detection. When a finger 140 is pressed against the fingerprint detection area 103, the display screen 120 emits a beam of light 111 to a target finger 140 above the fingerprint detection area 103, and the light 111 is reflected on a surface of the finger 140 to form reflected light or form scattered light after scattering inside the finger 140. In related patent applications, the above reflected light and scattered light are collectively referred to as reflected light for convenience of description. Since a ridge and a valley of a fingerprint have different light reflecting capabilities, reflected light 151 from the ridge of the fingerprint and the reflected light 152 from the valley of the fingerprint have different light intensities. The reflected light is received by the pixel array composed of a plurality of pixel units 131 in the optical fingerprint apparatus 130 and converted into a corresponding electrical signal, that is, a fingerprint detection signal; and fingerprint image data may be acquired based on the fingerprint detection signal, and fingerprint matching verification may be further performed, thereby implementing an optical fingerprint identification function at the terminal device 10.

It should be understood that, in a specific implementation, the electronic device 10 further includes a transparent protective cover plate; and the cover plate may be a glass cover plate or a sapphire cover plate, which is located above the display screen 120 and covers a front face of the electronic device 10. Therefore, in the embodiment of the present application, the so-called finger being pressed against the display screen 120 actually refers to the finger being pressed against the cover plate above the display screen 120 or a surface of a protective layer covering the cover plate.

On the other hand, in some embodiments, the optical fingerprint apparatus 130 may include only one optical fingerprint sensor, and in this case, the fingerprint detection area 103 of the optical fingerprint apparatus 130 has a smaller area and a fixed position, therefore, when inputting the fingerprint, the user needs to press the finger to a specific position of the fingerprint detection area 103, otherwise the optical fingerprint apparatus 130 may not be able to collect an fingerprint image, thereby resulting in poor user experience. In other alternative embodiments, the optical fingerprint apparatus 130 may specifically include a plurality of optical fingerprint sensors which can be provided under the display screen 120 side by side in a splicing manner, and sensing areas of the plurality of optical fingerprint sensors collectively form the fingerprint detection area 103 of the optical fingerprint apparatus 130. In other words, the fingerprint detection area 103 of the optical fingerprint apparatus 130 may include a plurality of sub areas, each sub area corresponds to a sensing area of one of the optical fingerprint sensors, such that a fingerprint acquisition area 103 of the optical fingerprint apparatus 130 may be extended to a main area of a lower portion of the display screen, that is, it is extended to a generally pressed area by the finger, thereby implementing a blind pressing type of a fingerprint input operation. Alternatively, when the number of the optical fingerprint sensors is sufficient, the fingerprint detection area 130 may also be extended to a half of the display area or even the entire display area, thereby implementing half screen or full screen fingerprint detection.

It should be understood that in the embodiments of the present application, the pixel array in the optical fingerprint apparatus may also be referred to as a sensing array, and an optical pixel unit or a pixel unit in the pixel array may also be referred to as a sensing unit. In addition, the above optical fingerprint sensor may also be referred to as a fingerprint sensor or a fingerprint sensor chip.

It should also be understood that the optical fingerprint apparatus in the embodiments of the present application may also be referred to as an optical fingerprint identification module, a fingerprint identification apparatus, a fingerprint identification module, a fingerprint module, a fingerprint acquisition apparatus, or the like, and the above terms may be replaced with each other.

Generally, the optical fingerprint apparatus 130 further includes an optical component, which may be provided above the optical fingerprint sensor, and may include a filter, an optical path guiding structure, and other optical elements. The filter may be configured to filter out ambient light that affects the fingerprint identification, for example, the infrared radiation cut filter layer is configured to filter out infrared light in the ambient light.

At present, there are two main solutions for the optical path guiding structure in the under-display optical fingerprint apparatus mass-produced in the industry. One is to use a principle of through hole and hole imaging. A hole may guide an optical signal reflected by a finger to a sensor chip under a display screen to perform fingerprint identification. In theory, the smaller the aperture of the hole, the higher the resolution. However, in actual industrial manufacturing, the size of the hole cannot be further reduced, thus limiting improvement of its resolution. At the same time, since the hole only allows optical signals in a vertical direction to enter, the number of imaging signals is limited and cannot provide enough optical signals to an acquisition area of the sensor chip. The other is to use an optical lens for imaging, which is similar to a principle of camera imaging, and uses a spherical or aspherical lens to condense light to improve imaging resolution. In addition, since the lens has a function of converging light, the lens imaging can guide more optical signals to reach the sensor chip compared to the method of the hole imaging.

With the development of electronic devices in a direction of ultra-thin, at present, most of the fingerprint identification apparatuses adopt a structure of microlens-hole, that is, the fingerprint identification apparatus may include a microlens array and a light blocking layer, and the microlens array may be provided above the light blocking layer, and the light locking layer is provided with a hole array. The microlens array is configured to converge an optical signal reflected by a finger to the hole array, and the hole array may guide the received optical signal to a fingerprint sensor chip under the light blocking layer. The fingerprint sensor chip may perform fingerprint identification according to the received optical signal.

A microlens has a function of converging light, thereby improving resolution of an image generated by the fingerprint sensor chip. The hole array has a function of filtering the optical signal. For example, the hole array does not allow an interference optical signal with a large angle to pass through, but only allows an optical signal within a desired specific angle range to pass through, so as to improve an effect of fingerprint identification.

Due to an influence of factors such as skin thickness, hemoglobin concentration, melanin content of human skin tissue, reflection performance of human skin tissue to a specific waveband of light such as red light is significantly different from that of an artificial material such as silica gel, paper and adhesive tape. Therefore, a color filter layer may also be provided above part of pixel units in a pixel array to distinguish real and fake fingers.

In addition, different fingerprint identification environments correspond to different acquisition parameters, where the acquisition parameters are parameters used by the fingerprint identification apparatus to acquire a fingerprint optical signal, and the acquisition parameters may be, but are not limited to, exposure time. For example, the exposure time for acquiring the fingerprint optical signal in a strong light environment is shorter, and the exposure time for acquiring the fingerprint optical signal in a dark light environment is longer. If the fingerprint identification apparatus cannot accurately identify the current fingerprint identification environment when acquiring the fingerprint optical signal, for example, the strong light environment is misjudged as a normal environment, the acquisition parameters used by the fingerprint identification apparatus to acquire the fingerprint optical signal may not correspond to the fingerprint identification environment, and an fingerprint image appears mosaic, such that false rejection rate (FRR) and false acceptance rate (FAR) may increase, thereby greatly reducing accuracy of fingerprint identification. By providing the color filter layer on the part of pixel units, the color filter layer may transmit optical signals of different colors, such that the pixel units under it may sense the optical signals of different colors, and a strong light detection is performed based on the sensed optical signals of different colors, so as to identify a fingerprint identification environment, and then acquire the fingerprint optical signal based on the fingerprint identification environment, so as to improve the accuracy of fingerprint identification.

Figure 2:
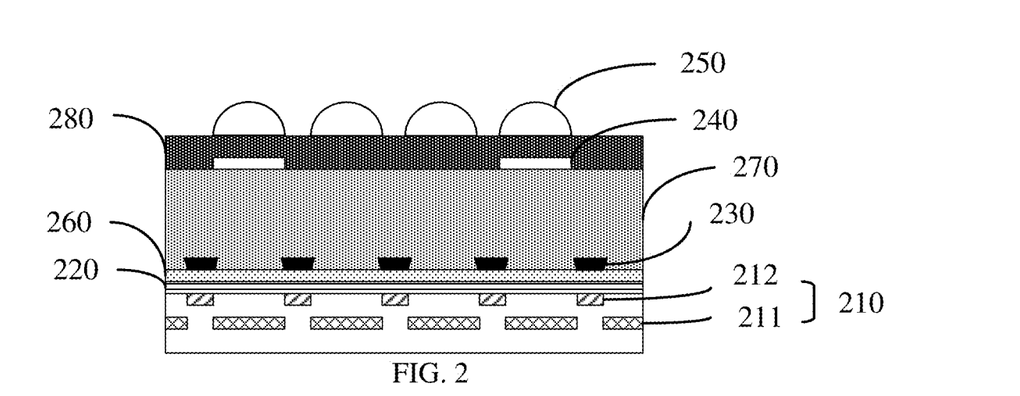
FIG. 2 is a schematic structural diagram of a fingerprint identification apparatus.

FIG. 2 shows a structural diagram of a fingerprint identification apparatus. As shown in FIG. 2, the optical fingerprint identification apparatus may include a fingerprint sensor chip 210, an infrared radiation cut (IRC) filter layer 220, a light blocking layer 230, a color filter layer 240 and a microlens array 250 from bottom to top in sequence.

Among them, the fingerprint sensor chip 210 may include a pixel array having a plurality of pixel units 211, and the pixel array may be configured to receive an optical signal returned by a finger to perform fingerprint identification. In addition, the fingerprint sensor chip 210 may also be provide with a metal pattern layer 212, and the metal pattern layer 212 is located above the pixel array. The metal pattern layer 212 is provided with a second hole array, which includes a plurality of second holes, and may be configured to guide the optical signal returned by the finger to the pixel array.

It could be understood that the metal pattern layer 212 is a circuit layer inside the fingerprint sensor chip 210, and the metal pattern layer 212 is equivalent to a light blocking layer inside the fingerprint sensor chip 210, which can further filter the optical signal returned by the finger, and guide the optical signal at a specific angle to the pixel array, thereby helping to reduce stray light, increasing collimation of incident light, and improving image contrast.

The second pinhole array in the metal pattern layer 212 may correspond to the plurality of pixel units in the fingerprint sensor chip one-to-one, one second hole in the second hole array corresponds to one pixel unit in the plurality of pixel units, and the hole can guide the optical signal returned by the finger to the corresponding pixel unit.

The fingerprint identification apparatus further includes the IRC filter layer 220. The IRC filter layer 220 may be deposited on an upper surface of the fingerprint sensor chip 210 by means of coating film (sputtering or evaporation), and the IRC filter layer 220 may be made of an inorganic coating material. The IRC filter layer 220 may be configured to filter out optical signals in an infrared waveband.

The fingerprint identification apparatus may further include the light blocking layer 230, and the light blocking layer 230 may be provided with a first hole array, and the first hole array includes a plurality of first holes. The first hole array may be formed by performing opening in the light blocking layer 230 according to a position of the metal pattern layer 212 or positions of the plurality of pixel units. An opening position of the first hole array needs to match a position of the second hole array in the metal pattern layer 212 and the positions of the plurality of pixel units. That is, the first hole array formed after the opening has a corresponding relationship with the pixel array of the fingerprint sensor chip 210 and the second hole array of the metal pattern layer 212.

The fingerprint identification apparatus may also include the microlens array 250, which can play a role of converging light and is conducive to improving resolution of a fingerprint image generated by the fingerprint sensor chip, where the microlens array 250 may include a plurality of microlenses. In addition, the plurality of microlenses have a corresponding relationship with the first hole array of the light blocking layer 230, the second hole array of the metal pattern layer 212 and the pixel array of the fingerprint sensor chip 210.

For example, one microlens in the microlens array 250 corresponds to one first hole in the first hole array, one first hole in the first hole array corresponds to one second hole in the second hole array, and one second hole in the second hole array corresponds to one pixel unit in the pixel array, that is, the microlens in the microlens array 250, the first holes in the first hole array, the second holes in the second hole array and the pixel units in the pixel array are respectively in one-to-one correspondence.

For another example, one microlens in the microlens array 250 corresponds to one first hole in the first hole array, one first hole in the first hole array corresponds to a plurality of second holes in the second hole array, and one second hole in the second hole array corresponds to one pixel unit in the pixel array, that is, one microlens in the microlens array 250 corresponds to one first hole in the first hole array, to a plurality of second holes in the second hole array, and to a plurality of pixel units in the pixel array. And for example, one microlens corresponds to one first hole, to four second holes, and to four pixel units; one microlens correspond to one first hole, to nine second holes, and to nine pixel units; or one microlens correspond to one first hole, to sixteen second holes, and to sixteen pixel units and so on.

For another example, one microlens in the microlens array 250 corresponds to a plurality of first holes in the first hole array, one first hole in the first hole array corresponds to one second hole in the second hole array, and one second hole in the second hole array corresponds to one pixel unit in the pixel array, that is, one microlens in the microlens array 250 corresponds to a plurality of first holes in the first hole array, to a plurality of second holes in the second small hole array, and to a plurality of pixel units in the pixel array. And for example, one microlens corresponds to four first holes, to four second holes, and to four pixel units; one microlens corresponds to nine first holes, to nine second holes, and to nine pixel units; and one microlens corresponds to sixteen first holes, to sixteen second holes, and to sixteen pixel units and so on.

The fingerprint identification apparatus may further include the color filter layer 240, which belongs to a patterned layer, that is, the color filter layer 240 is merely provided above part of pixel units (that is, the part of pixel units) in the fingerprint sensor chip, and color filter layers in the remaining areas may be removed by a exposure and development process. In other words, the fingerprint identification apparatus actually includes a plurality of color filter units, which are provided above the part of pixel units (this part of pixel units may be recorded as characteristic pixel units), and most of the pixel units, above which are not provided color filter units, allows a visible light signal used for fingerprint identification to enter (this part of pixel units may be recorded as common pixel units). Optionally, a transparent material may be filled above the common pixel units to remain flat with the characteristic pixel units.

Generally, the pixel array may include effective pixel units and dark pixel units, where an effective pixel unit is a pixel unit configured for photosensitivity, a dark pixel is a pixel unit that is a non-photosensitive pixel unit, and the dark pixel unit is configured to detect an output signal when there is no optical signal, that is, to detect a background noise of the pixel unit, such that a real output signal may be acquired by subtracting the background noise from the output signal of the effective pixel unit, thereby improving image quality.

Figure 3:
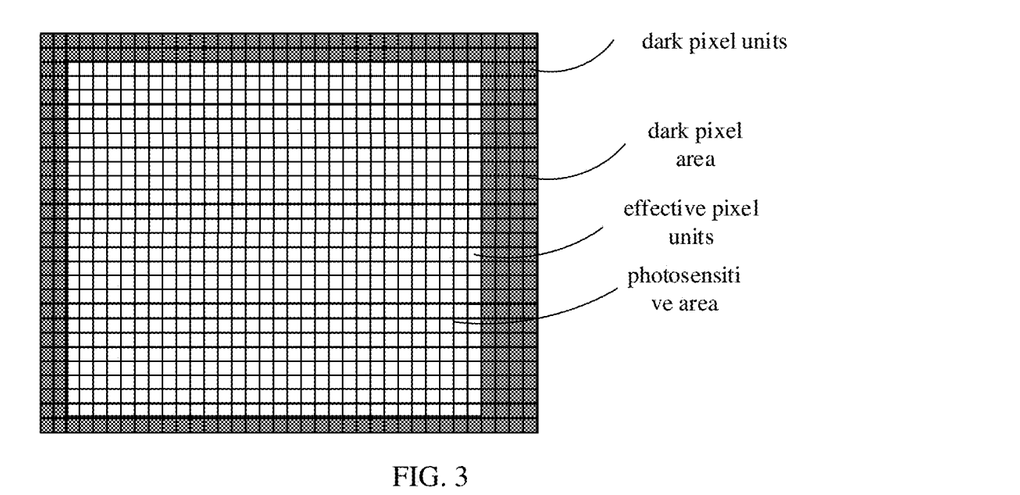
FIG. 3 is a distribution diagram of effective pixel units and dark pixel units in a pixel array according to an embodiment of the present application.

As shown in FIG. 3, dark pixel units are generally provided around effective pixel units. That is, pixel units in a central area of a pixel array are the effective pixel units, and the central area may also be referred to as a photosensitive area, while pixel units in a peripheral area are the dark pixel units, and the peripheral area may also be referred to as a dark pixel area.

Figure 4:
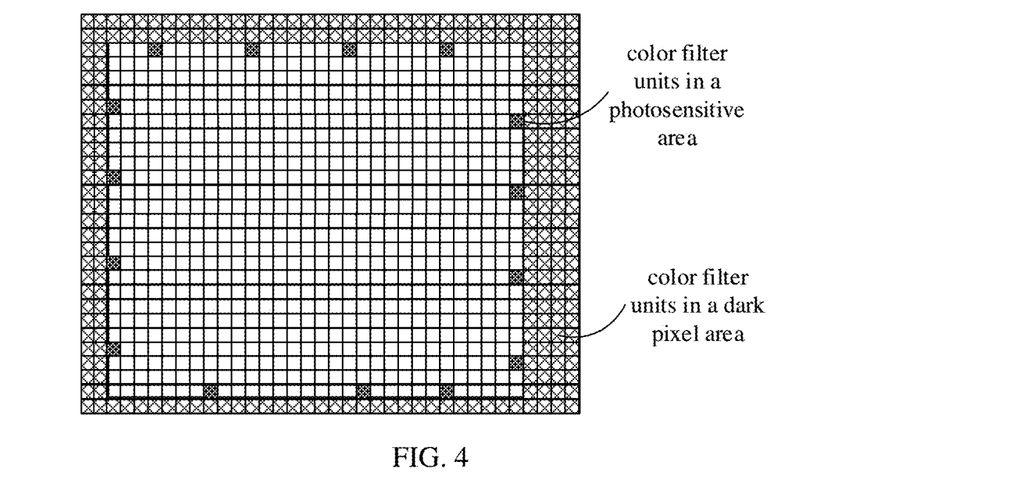
FIG. 4 is a distribution diagram of a first color filter unit according to an embodiment of the present application.
Figure 5:
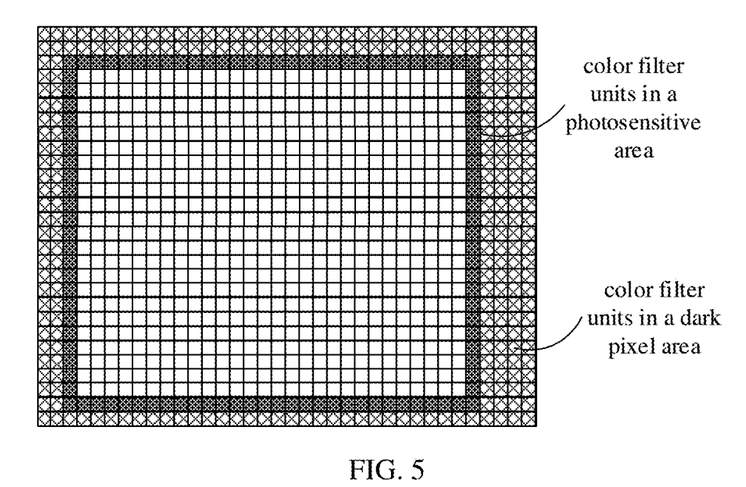
FIG. 5 is another distribution diagram of a second color filter unit according to an embodiment of the present application.

In addition to being provided above the effective pixel units, a color filter layer may also be provided above the dark pixel units. That is, the color filter layer includes a plurality of color filter units provided above the effective pixel units and a plurality of color filter units provided above the dark pixel units. For example, several color filter units may be provided above the effective pixel units of at least one circle at an outermost periphery of the photosensitive area, and the several color filter units may be discretely provided, as shown in FIG. 4. For another example, several color filter units may be provided above the effective pixel units of at least one circle at an outermost periphery of a photosensitive area, and the several color filter units may be continuously provided, as shown in FIG. 5. For example, several color filter units may be provided above the effective pixel units of such as one circle, two circles or three circles at the outermost periphery of the photosensitive area. It should be understood that the less the number of color filter units is set, the smaller the impact on fingerprint identification.

Optionally, the plurality of color filter units provided above the dark pixel units may be in a grid shape, which may surround and connect the plurality of color filter units provided above the effective pixel units to protect and prevent peeling off of the color filter units above the effective pixel units.

Figure 6:
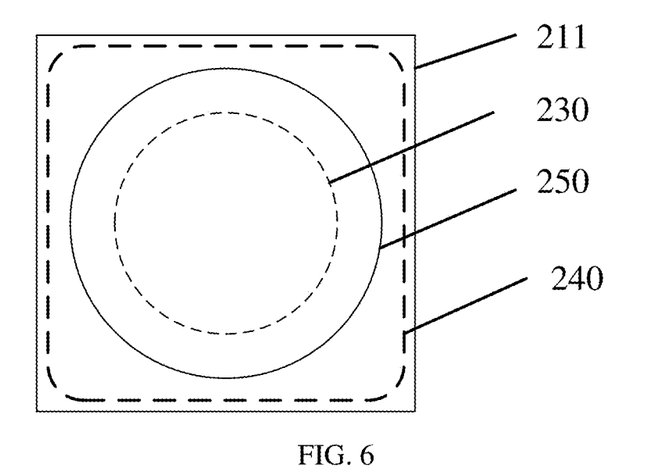
FIG. 6 is a top view of a relative position of each laminated layer in a fingerprint identification apparatus.

FIG. 6 shows a top view of a relative position of each laminated layer above a pixel unit provided with a color filter layer. In a pixel unit, a light blocking layer, a color filter layer, and a microlens are provided from bottom to top in sequence. Since an IRC filter layer is provided above the pixel unit of the entire fingerprint sensor chip, the IRC filter layer is not shown here. Generally, the color filter layer is designed to fill the entire pixel area, and an opening of a light blocking layer and a size of the microlens may be set according to requirements.

At present, a light blocking layer 230 is mainly made by means of coating a black matrix (BM) photoresist, and a fingerprint identification apparatus has very high requirements on optical absorption performance of a material of the light blocking layer, thus the light blocking layer 230 is generally implemented with a black glue material. In order to increase adhesion between a IRC filter layer 220 and the light blocking layer 230 of the black glue material, a transparent dielectric layer 260 needs to be provided between the two as an adhesion buffer layer, so as to improve adhesion intensity between the light blocking layer 230 and the IRC filter layer. In addition, since the IRC filter layer 220 may only cover part of area on a fingerprint sensor chip 210, in order to avoid a coating effect of the black matrix photoresist caused by an undulating topography of its patterned edge, the transparent dielectric layer 260 may be added between the IRC filter layer 220 and the light blocking layer 230, and the transparent dielectric layer 260 further has a function of flattening a surface of the IRC filter layer 220. In addition, since the light blocking layer 230 and a color filter layer 240 are both patterned topography, that is, neither the light blocking layer 230 nor the color filter layer 240 is a flat layer, for example, the light blocking layer 230 needs to be processed to have a first hole array, and the color filter layer 240 needs to be processed to only cover part of pixel units, a transparent dielectric layer 270 needs to be provided between the light blocking layer 230 and the color filter layer 240, and a transparent dielectric layer 280 needs to be provided between the color filter layer 240 and a microlens array 250 to flatten a surface of the light blocking layer 230 and a surface of the color filter layer 240.

To sum up, a structure of the fingerprint identification apparatus shown in FIG. 2 needs to be provided with three transparent dielectric layers, and in general, an optical path structure is relatively complex, processing process is cumbersome, and output efficiency is relatively low.

In addition, the applicants found that since the black glue is basically negative photoresist, its characteristic is that a cross section of a hole is regular trapezoid after exposure and development, and a lower base is longer than an upper base in the regular trapezoid, such that the black glue forms a concave structure at the bottom of the hole. If the color filter layer 240 is directly provided on an upper surface of the light blocking layer 230, it may bring a series of problems: 1. the color filter layer of the negative photoresist is generally thinner than the light blocking layer, and the concave structure of the light blocking layer may affect a fluid behavior of the negative photoresist when the color filter layer is coated, resulting in poor coating performance of the color filter layer and breaking or discontinuity of an adhesive layer of the negative photoresist, which is prone to peeling off of the color filter layer or other reliability problems; and as shown in FIG. 7, the concave structure at P can result in the poor coating performance of the color filter layer; and 2. the concave structure of the light blocking layer is easy to cause incomplete development of the color filter layer, that is, there may be residual material of the color filter layer in an aperture of the light blocking layer; if there is the residual material of the color filter layer that does not need to be retained in the aperture of the light blocking layer of the color filter layer, part of red light may enter a photosensitive unit that normally only needs a white light signal to enter, which may interfere with recognition of a normal fingerprint signal and affect quality of fingerprint image and recognition performance; and as shown in FIG. 7, the concave structure at Q can result in the residual material of the color filter layer.

Figure 7:
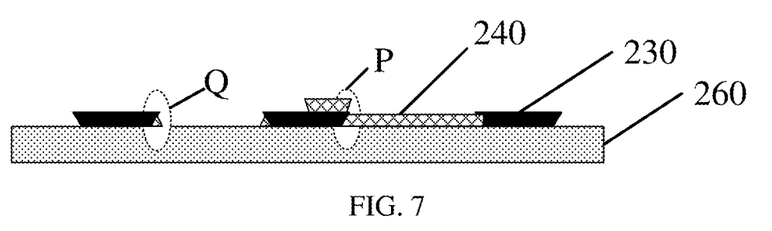
FIG. 7 is a schematic diagram of residual presence in a color filter layer directly covering a light blocking layer.

It should be noted that reference numerals 230, 240 and 260 in FIG. 7 are the same as components represented in FIG. 2 and FIG. 6, for example, 230 represents a light blocking layer, 240 represents a color filter layer, and 260 represents a transparent dielectric layer between an infrared radiation cut filter layer 220 and the light blocking layer 230.

Therefore, the embodiments of the present application provide a fingerprint identification apparatus, which may not only reduce the number of required transparent dielectric layers, greatly simplify the optical path laminated structure and processing process, thereby improving the efficiency of mass production. In addition, the fingerprint identification apparatus in the embodiments of the present application also does not have a problem of affecting an effect of fingerprint identification due to incomplete development of the color filter layer.

Hereinafter, the fingerprint identification apparatus according to the embodiments of the present application will be described in detail with reference to FIGS. 8 to 10.

Figure 8:
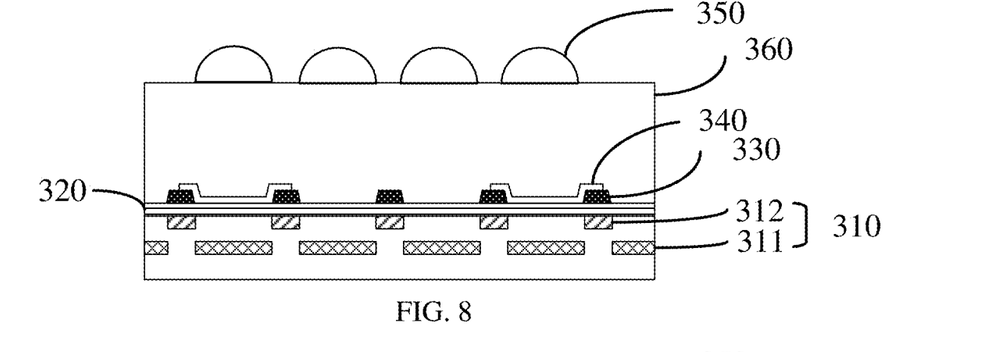
FIG. 8 is a schematic structural diagram of a fingerprint identification apparatus according to an embodiment of the present application.

As shown in FIG. 8, a fingerprint identification apparatus 300 can be applied to an electronic device with a display screen, and the fingerprint identification apparatus 300 can be provided under the display screen. The fingerprint identification apparatus 300 includes: a fingerprint sensor chip 310, an IRC filter layer 320, a light blocking layer 330, a light transmitting dielectric layer including a first color filter unit 340, and a microlens array 350 from bottom to top in sequence.

The light blocking layer 330 may be provided on an upper surface of the IRC filter layer 320 by means of coating film, and the light blocking layer 330 may be provided with a first hole array. cross sections of holes in the first hole array is inverse trapezoid, and an upper base is longer than a lower base in the inverse trapezoid.

Optionally, coating film may include sputtering or vapor deposition.

A non-opening area of the light blocking layer 330 has a strong absorption effect on an optical signal of a specific waveband, such as reflectance and transmittance of the non-opening area of the light blocking layer 330 to an optical signal in a waveband of 400 nm~1200 nm are less than 0.1%, that is, an optical density (OD) value is greater than or equal to 3, the light blocking layer 330 formed by coating film may implement the same optical absorption effect as black matrix photoresist shown in FIG. 2, such that most of optical signals in the waveband of 400 nm~1200 nm reaching the non-opening area may be absorbed by the non-opening area.

A material used for the light blocking layer 330 is not specifically limited in the embodiments of the present application. For example, the light blocking layer may be made of at least one of the following materials: metal, non-metallic compound and metal oxide.

Non-metallic compounds may include, for example, non-metallic oxides and/or nitrides. Metal, for example, may include at least one of the following: chromium (Cr), copper (Cu), nano-silver (Ag); non-metal oxide, for example, may be silicon dioxide ($SiO_2$); nitride, for example, may be silicon nitride ($SiN_x$); metal oxide may include, for example, titanium oxide ($TiO_2$) and/or niobium oxide ($Nb_2O_5$).

The light blocking layer 330 may also be made of two or more of the above materials, and is a micro nano laminated structure formed by overlapping and depositing these materials, and a deposition thickness may be 1-3 μm.

For example, the light blocking layer 330 may be a sandwich like structure. In a manufacturing process, a 300-500 nm nano silver film or copper film may be deposited on a bottom layer, then a dielectric isolation layer $SiO_2$ or $TiO_2$ with a thickness of 100-200 nm may be deposited, and finally a relatively thin silver film is deposited on a top layer with a thickness of 10-50 nm and a surface nanoparticle island structure, and an optical total absorption effect is implemented by an electron coupling between a micro nano structure and an incident light wave.

In the embodiments of the present application, a thickness of the light blocking layer 330 may be set according to actual requirements of a product, for example, the thickness of the light blocking layer 330 may be 0.5-5 μm, and furthermore, the thickness of the light blocking layer 330 is 0.5-3 μm.

The first hole array on the light blocking layer 330 may be formed by using an etching process or a lift-off process after exposure and development.

The first color filter unit 340 may be formed in part of holes in the first hole array to cover the part of holes.

Since the light blocking layer 330 is made by means of coating film, and the cross section of the hole therein may be inverse trapezoid, such that the color filter layer 340 may be made directly on an upper surface of the light blocking layer 330.

It should be noted that, the cross section of the hole may also be a rectangle, or an inverse trapezoid of which a side wall and a bottom of the hole are approximately vertical in the embodiments of the present application, which is not limited in the embodiments of the present application.

Optionally, the first color filter units 340 may be provided in the hole above part of pixel units. For example, one first color filter unit is provided above one pixel unit. The pixel unit provided with the first color filter unit may be recorded as a characteristic pixel unit, and a fingerprint image acquired by the characteristic pixel unit is a low resolution color fingerprint image. For different materials (for example, artificial materials such as human fingers and silicone), the low resolution color fingerprint image has significantly different characteristics. Therefore, according to a difference between low resolution color fingerprint images acquired by the characteristic pixel unit, whether the fingerprint image is real or fake can be determined.

That is, the first color filter units 340 may play a role of anti-counterfeiting of real and fake fingers. Optionally, the first color filter units 340 may further play a role of identifying a strong ambient light scene.

Optionally, the first color filter units 340 may be provided above effective pixel units of at least one circle at an outermost periphery of a photosensitive area. For example, the first color filter units 340 may be provided above the effective pixel units of one circle, two circles, or three circles at the outermost periphery of the photosensitive area. It should be understood that the smaller the number of the first color filter units 340 is set, the smaller the influence on fingerprint identification.

Optionally, the first color filter units 340 may also be provided above dark pixel units in a dark pixel area, and the first color filter units 340 provided above the dark pixel units may surround and contact the first color filter units provided above the effective pixel units in a grid shape to protect and prevent peeling off of the first color filter units 340 provided above the effective pixel units.

As shown in FIG. 4, first color filter units 340 provided above effective pixel units may be discretely distributed; and as shown in FIG. 5, first color filter units 340 provided above effective pixel units may also be continuously distributed.

Optionally, the first color filter units 340 may be formed in part of first holes by firstly coating an organic color resist material on the upper surface of a light blocking layer 330 and then performing patterning by exposure and development.

Specifically, a negative photoresist topography of an inverse trapezoid shape may be formed by exposure patterned definition of conventional negative photoresist, and then coating film is performed on it, and after a lift off process is adopted to remove the photoresist, an opening with an inverse trapezoid cross-section is formed. Based on this structure, a color filter layer of an organic adhesive material is then coated. Since the opening of the light blocking layer is inverse trapezoid, that is, an aperture gradually narrows from top to bottom, which may not cause poor coating performance of the color filter layer. Therefore, it is feasible to directly coat the first color filter units on the light blocking layer. After the coated first color filter units are patterned by exposure and development, it is merely formed above part of pixel units.

A process of coating the color filter unit is relatively mature, and an operation is relatively simple.

Optionally, the first color filter unit 340 may be formed in the part of first holes by firstly coating an inorganic material on an upper surface of a light blocking layer 330, and then performing patterning through a lift-off process.

Specifically, a negative photoresist topography of an inverse trapezoid shape may be formed by exposure patterned definition of conventional negative photoresist, and then coating film is performed on it, and after a lift off process is adopted to remove the photoresist, an opening with an inverse trapezoid cross-section is formed. Coating film is performed based on the structure (a coating film material may achieve the same filter spectrum as an organic color filter material), and then the photoresist is removed through the lift-off process, a part of the negative photoresist is lifted-off (a coating film layer on the negative photoresist is also lifted-off synchronously), leaving the coating film layer material that needs a material filter layer, so as to implement patterning of a coating film color filter layer.

Since the light blocking layer is made by means of coating film, from a viewpoint of process integration and synchronous implementation, the first color filter unit may also be made by means of coating film.

Inorganic materials may include, for example, $SiO_2$, $TiO_2$, and $Nb_2O_5$.

Optionally, in the embodiments of the present application, the first color filter unit generally only allows an optical signal within a specific waveband range to pass through, while a waveband range of emitted light of a light source for fingerprint detection needs to include a waveband range of the first color filter unit and at least part of other wavebands expect the waveband, that is, the waveband of the first color filter unit only includes part of wavebands of the emitted light. In this way, after the emitted light is reflected on a surface of an object to be identified, the emitted light enters the first color filter unit, and after passing through the first color filter unit, part of optical signals are filtered while part of optical signals are allowed to pass through, imaging is further performed on a characteristic pixel unit, thereby acquiring a low resolution color fingerprint image.

For example, if the light source emits white light, that is, a white light spot is displayed in a fingerprint detection area, the first color filter unit may be a red filter unit that allows merely a red light waveband to pass through, or may be a blue filter unit that allows merely a blue light waveband to pass through, or may be a green filter unit that allows merely a green light waveband to pass through, or may be a cyan filter unit that allows both green light and blue light wavebands to pass through, or the like, as long as the first color filter unit can filter out optical signals of part of wavebands while allowing optical signals of other wavebands to pass through, and the embodiments of the present application are not limited thereto.

For example, a waveband range of the blue filter unit may be 440~475 nm in a center waveband and 550 nm in an upper cut off waveband, and transmittance of blue light is higher than that of green light and red light; a waveband range of the green filter unit may be 520~550 nm in a center waveband, 620 nm and 460 nm in upper and lower cut off wavebands, and transmittance of green light is higher than that of blue light and red light; and a waveband range of the red filter unit may be about 550 nm in a lower cut off waveband, and transmittance of red light is higher than that of green light and blue light.

Optionally, a thickness of the first color filter unit in the fingerprint identification apparatus provided in the embodiments of the present application may be 0.5~3 μm.

The thickness of the color filter unit is configured to adjust transmittance of light passing through the color filter unit, and different thicknesses may implement different transmittances, which may then correspond to different performance requirements.

Figure 9:
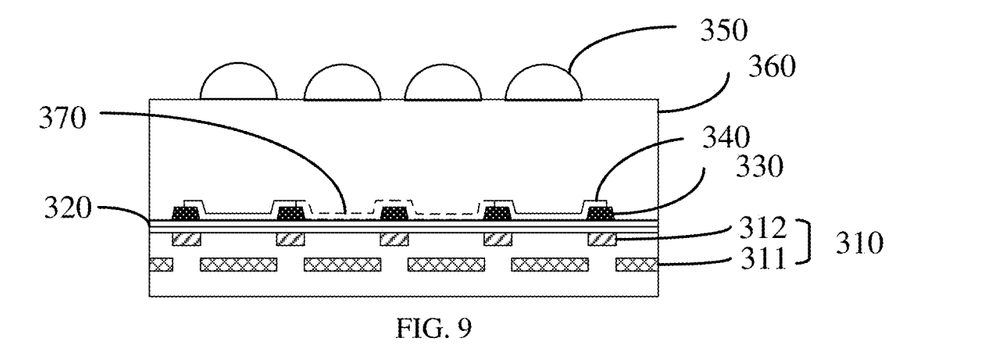
FIG. 9 is another schematic structural diagram of a fingerprint identification apparatus according to an embodiment of the present application.

Optionally, as shown in FIG. 9, the light transmitting dielectric layer may further include second color filter units 370, and the second color filter units 370 are formed in another part of first holes in a first hole array other than part of first holes filled by the first color filter units 340. The second color filter units 370 are configured to transmit light of at least one waveband among red light, blue light and green light. Specifically, the second color filter units 370 are configured to transmit light of a different color from the first color filter units 340, for example, a first color filter unit 340 is configured to transmit the red light, and a second color filter unit 370 is configured to transmit the green light. Or, the first color filter unit 340 is configured to transmit the green light, and the second color filter unit 370 is configured to transmit the blue light, or the like.

By providing the second color filter unit, it is conducive to reducing an effect of an ambient light signal, such that performance of fingerprint identification may be improved.

Optionally, the second color filter unit 370 and the first color filter unit 340 are formed in a similar manner. For example, the second color filter units 370 are formed in the another part of the first holes by the organic color resist material after coating and patterning by exposure and development. For another example, the first color filter unit 370 is formed in the another part of the first holes by the inorganic material after coating film and patterning by a lift-off process.

Optionally, the thickness of the second color filter unit 370 may be the same or different from that of the first color filter unit, for example, may be 0.5-3 μm.

Optionally, the materials adopted by the second color filter unit 370 and the first color filter unit 340 may be the same or different. For example, the second color filter unit 370 is made of at least one of silicon dioxide, titanium dioxide or niobium pentoxide.

Figure 10:
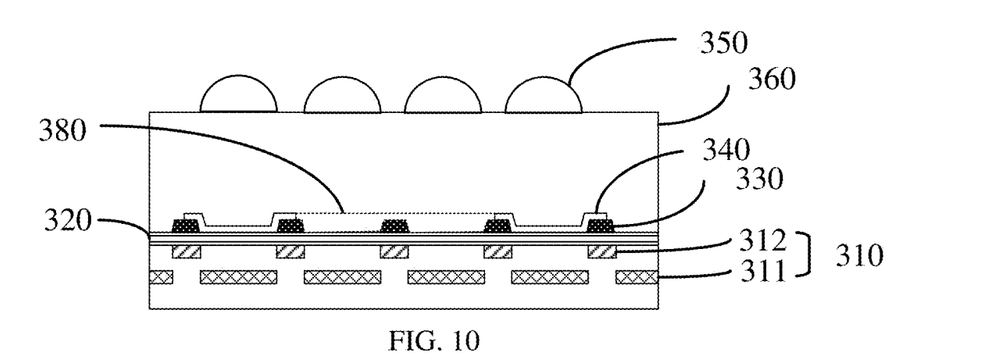
FIG. 10 is another schematic structural diagram of a fingerprint identification apparatus according to an embodiment of the present application.

Optionally, as shown in FIG. 10, the light transmitting dielectric layer may further include a first transparent dielectric layer 380, and the transparent dielectric layer 380 is formed in another part of first holes in a first hole array other than part of first holes filled by a first color filter unit 340.

Optionally, the first transparent dielectric layer 380 has greater light transmittance, for example, transmittance of the first transparent dielectric layer 380 to an optical signal in a visible light waveband is greater than 98%.

Optionally, the first transparent dielectric layer 380 may be provided in the another part of first holes in the first hole array by means of coating or coating film.

A process of coating the transparent dielectric layer is relatively mature, an operation is relatively convenient, and a surface of an optically transparent dielectric layer formed by means of coating is relatively flat. Therefore, the first transparent dielectric layer 380 may be made by means of coating.

Optionally, if the first transparent dielectric layer 380 is made by means of coating, an organic material may be adopted.

In addition, the first transparent dielectric layer 380 may also be made by means of coating film. Optionally, if the first transparent dielectric layer 380 is made by means of coating film, an inorganic material may be used.

Since the first transparent dielectric layer 380 has relatively high requirements on optical transparency, an inorganic oxide layer may be selected. For example, the first transparent dielectric layer 380 may be made of at least one of the following materials: silicon nitride, silicon dioxide, silicon oxynitride, or the like.

As shown in FIG. 9 and FIG. 10, the fingerprint identification apparatus may further include a second transparent dielectric layer 360 configured to flatten a surface of a laminated structure formed by a light blocking layer 330 and a light transmitting dielectric layer. Optionally, the second transparent dielectric layer 360 may further be configured to adjust an optical path of an optical signal returned by a finger to a fingerprint sensor chip 310.

The second transparent dielectric layer 360 has greater light transmittance, for example, transmittance of the second transparent dielectric layer 360 to an optical signal in a visible light waveband is greater than 98%.

Since the optical path from the optical signal returned by the finger to the fingerprint sensor chip may affect detection performance of the fingerprint sensor chip, in the embodiments of the present application, a size of the optical path may be adjusted through the second transparent dielectric layer 360, such that the fingerprint sensor chip has better detection performance. The larger the thickness of the second transparent dielectric layer 360, the longer the optical path; and the smaller the thickness of the second transparent dielectric layer 360, the shorter the optical path.

The thickness of the second transparent dielectric layer 360 in the embodiments of the present application may be, for example, 5-15 μm.

Optionally, the second transparent dielectric layer 360 may be provided by means of coating or coating film.

A process of coating the transparent dielectric layer is relatively mature, an operation is relatively convenient, and a surface of an optically transparent dielectric layer formed by means of coating is relatively flat. Therefore, the second transparent dielectric layer 360 may be made by means of coating.

Optionally, if the second transparent dielectric layer 360 is made by means of coating, an organic material may be adopted.

In addition, since the light blocking layer 330 is made by means of coating film, from a viewpoint of process integration and synchronous implementation, the second transparent dielectric layer 360 may also be made by means of coating film. Optionally, if the second transparent dielectric layer 360 is made by means of coating film, an inorganic material may be used.

Since the second transparent dielectric layer 360 has relatively high requirements on optical transparency, an inorganic oxide layer may be selected. For example, the second transparent dielectric layer 360 may be made of at least one of the following materials: silicon nitride, silicon dioxide, silicon oxynitride, or the like.

Since a surface of the second transparent dielectric layer 360 made by means of coating film is not flat, optionally, in the embodiments of the present application, the surface of the second transparent dielectric layer 360 may also be flattened by using a contact layer.

Optionally, the first transparent dielectric layer 380 and the second transparent dielectric layer 360 may be integrated as a whole, as shown in FIG. 8, that is, the fingerprint identification apparatus does not include the first transparent dielectric layer 380, but only includes the second transparent dielectric layer 360. In addition to covering the first color filter unit 340 and the light blocking layer 330, the second transparent dielectric layer 360 also fills the another part of first holes in the first hole array other than the part of first holes filled by the first color filter unit 340.

It should be understood that a IRC filter layer 320 in the embodiments of the present application is not only configured to filter out infrared light, but may also be configured to filter out an optical signal in a non-target waveband, so as to prevent the optical signal in the non-target waveband from affecting fingerprint identification. An optical signal of a target waveband can be, for example, an optical signal for fingerprint detection, and the optical signal of the non-target waveband may be, for example, an optical signal of red light and infrared light wavebands.

The embodiments of the present application does not specifically limit a providing manner of the IRC filter layer 320. The IRC filter layer 320 may be a coating film layer formed on an upper surface of the fingerprint sensor chip 310, or the IRC filter layer 320 may be combined with other transparent carriers to form an optical filter, and then the optical filter is provided on a surface of the fingerprint sensor chip.

Preferably, the IRC filter layer 320 may be provided on the upper surface of the fingerprint sensor chip 310 by means of coating film. In this case, the fingerprint sensor chip 310, may not only be used for fingerprint identification according to the received optical signal, but also be used as a substrate carrying the IRC filter layer 320 to form a filter together with the IRC filter layer 320.

In addition to being provided between the fingerprint sensor chip 310 and the light blocking layer 330, the IRC filter layer 320 may also be provided above the light blocking layer 330. In this case, the light blocking layer 330 may be provided on the upper surface of the fingerprint sensor chip 310 by means of coating film. Or, the IRC filter layer 320 may also be provided above the color filter layer 340, and a position of the IRC filter layer 320 is not limited in the embodiments of the present application.

The fingerprint identification apparatus further includes a microlens array 350 provided on an upper surface of the transparent dielectric layer 360. The microlens in the embodiments of the present application may be a circular lens, or the microlens may be a polygonal lens, such as a square lens or hexagonal lens.

The fingerprint sensor chip 310 may be configured to receive an optical signal reflected from a finger above a display screen, converged by the microlens array 350, and then transmitted through a first hole array of the light blocking layer 330, where the optical signal may be used for fingerprint identification. Specifically, the fingerprint sensor chip 310 may include a pixel array having a plurality of pixel units 311, and the pixel array may be configured to receive the optical signal reflected from the finger above the display screen, converged by the microlens array 350, and then transmitted through the first hole array of the light blocking layer 330.

The fingerprint sensor chip 310 may also be provided with a metal pattern layer 312, the metal pattern layer 312 is located above the pixel array, and the metal pattern layer 312 is provided with a second hole array, and the second hole array may be configured to guide an optical signal returned by the finger to the pixel array. That is, the pixel array may be configured to receive an optical signal reflected from the finger above the display screen, converged by the microlens array 350, and then transmitted through the first hole array of the light blocking layer 330 and the second hole array of the fingerprint sensor chip 310.

It should be understood that the metal pattern layer 312 is a circuit layer inside the fingerprint sensor chip 310. The metal pattern layer 312 may be equivalent to the light blocking layer inside the fingerprint sensor chip 310, and may filter the optical signal returned by the finger and guide the optical signal at a specific angle to the pixel array.

The second hole array in the metal pattern layer 312 has a corresponding relationship with the pixel array in the fingerprint sensor chip 310. A hole in the second hole array corresponds to a pixel unit in the pixel array, and the hole may guide the optical signal returned by the finger to the corresponding pixel unit.

Therefore, in the fingerprint identification apparatus provided by the embodiments of the present application, the light blocking layer is made by means of coating film, such that the hole of the light blocking layer may be in an inverse trapezoid shape, the color filter unit may be directly provided above the light blocking layer, which reduces the number of transparent dielectric layers between the light blocking layer and the color filter layer, greatly simplifies an optical path laminated structure and processing process, and improves efficiency of mass production in the case that an effect of fingerprint identification is not affected. At the same time, since the hole of the light blocking layer is in the inverse trapezoid shape, the color filter unit (the part need to be removed) may be fully developed in the hole of the light blocking layer that does not require the color filter unit, that is, it will not affect normal entry of a white light signal due to residual materials of the color filter unit in the hole, such that fingerprint image quality is decreased, and an identification success rate is further affected.

In addition, the light blocking layer is not made by means of coating BM photoresist, but by means of coating film. By matching a film layer thickness and a structure of a specific type of material, an optical effect equivalent to that of the BM photoresist can be implemented. To a certain extent, it can enrich selection of materials and broaden ways of preparation, which is conducive to development and application of the fingerprint identification apparatus, and can alleviate a bottleneck of capacity.

In a structure of the above fingerprint identification apparatus, there is a corresponding relationship among a microlens array 350, a first hole array in a light blocking layer 330, a second hole array in a metal pattern layer 312, and a pixel array in a fingerprint sensor chip 310, which may refer to a corresponding relationship between a microlens array 250, a first hole array in a light blocking layer 230, a second hole array in a metal pattern layer 212 and a pixel array in a fingerprint sensor chip 210 in FIG. 2, and for the sake of brevity, it is not be repeated here.

Optionally, an optical center of a first microlens in a microlens array 350, a center of a first hole in a first hole array, and a center of a second hole in a second hole array correspond to a center of a first pixel unit in a pixel array, that is, the optical center of the first microlens, the center of the first hole, the center of the second hole and the center of the first pixel unit are located or approximately located on a straight line, which may ensure that the first pixel unit can receive the optical signal returned by the finger to perform fingerprint identification.

The straight line where the four centers are located may be perpendicular to the surface of the fingerprint sensor chip or may be inclined with respect to the surface of the fingerprint sensor chip, which is not specifically limited in the embodiments of the present application.

Optionally, the pixel units in the fingerprint sensor chip 310 may also be distributed in an array, and the microlenses in the microlens array 350 do not correspond to the pixel units one by one. For example, a microlens may correspond to a plurality of pixel units, and each pixel unit corresponds to a light guide channel. The light guide channel may be composed of a first hole array and a second hole array. Therefore, a pixel unit may receive an inclined optical signal that is converged by its corresponding microlens and then transmitted through the corresponding light guide channel.

FIG. 2 and FIGS. 8 to 10 are only described by taking an example that a fingerprint sensor chip includes a light blocking layer on the outside, but the embodiments of the present application are not limited thereto. The fingerprint sensor chip may also include two or more light blocking layers outside, and a plurality of light blocking layers may be provided by stacking.

If the fingerprint identification apparatus includes a plurality of light blocking layers, an aperture of a hole located on an upper layer of the light blocking layer may be larger than an aperture of a hole located on a lower layer of the light blocking layer.

Figure 11:
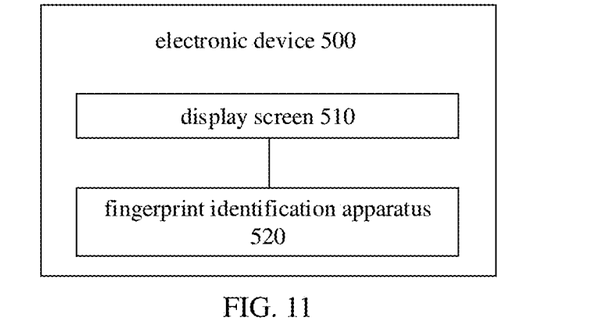
FIG. 11 is a schematic block diagram of an electronic device according to an embodiment of the present application.

FIG. 11 shows a schematic block diagram of an electronic device provided by the embodiments of the present application. The electronic device 500 includes a display screen 510 and a fingerprint identification apparatus 520. The fingerprint identification apparatus 520 may be provided under the display screen 510 to perform fingerprint identification on a finger above the display screen 510.

The display screen 510 may be any one of display screens described above, and the display screen 510 may be, for example, a self-emitting display screen, such as an OLED screen.

The fingerprint identification apparatus 520 may be any one of fingerprint identification apparatuses described above, and to simplify the description, it will not be repeated here.

Figure 12:
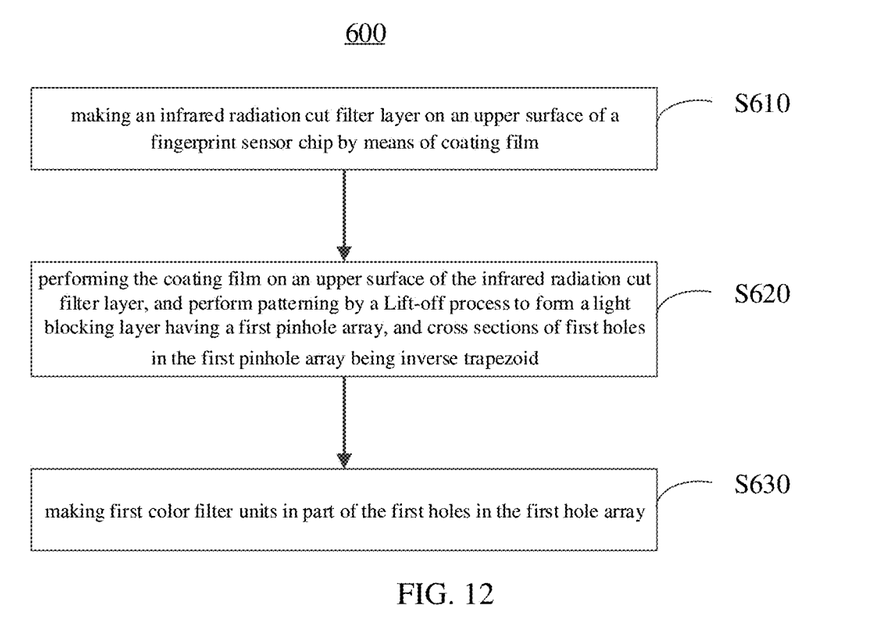
FIG. 12 is a schematic flowchart of a method of preparing a fingerprint identification apparatus according to an embodiment of the present application.

FIG. 12 shows a schematic flowchart of a method 600 of preparing a fingerprint identification apparatus further provided by the embodiments of the present application. The method 600 further includes:

S610, making an infrared radiation cut filter layer on an upper surface of a fingerprint sensor chip by means of coating film;

S620, performing coating film on an upper surface of the infrared radiation cut filter layer, and performing patterning by a lift-off process to form a light blocking layer having a first hole array, and cross sections of first holes in the first hole array being inverse trapezoid;

S630, making first color filter units in part of first holes in the first hole array, and the first color filter units being configured to transmit light of at least one waveband among red light, blue light and green light.

Optionally, in one embodiment, a negative photoresist topography of an inverse trapezoid shape may be formed by exposure patterning definition of conventional negative photoresist, and then coating film is performed on it, and after a lift-off process is adopted to remove the photoresist, an opening with an inverse trapezoid cross-section is formed. Based on this structure, a color filter layer of an organic adhesive material is then coated. Since an opening of the light blocking layer is inverse trapezoid, that is, an aperture gradually narrows from top to bottom, which may not cause poor coating performance of the color filter layer. Therefore, it is feasible to directly coat the color filter layer on the light blocking layer. After the coated color filter layer is patterned by exposure and development, it merely covers part of holes of the light blocking layer.

Specifically, the organic adhesive material may be firstly coated on the upper surface of the light blocking layer and in the first hole array, then the photoresist (an organic color resist material) coated on the upper surface of the light blocking layer and in the first hole array is patterned and exposed, the exposed organic adhesive material is removed by development, then etching is performed, and finally the remaining organic adhesive material is lifted-off, and first color filter units covered in the part of holes of the light blocking layer are formed.

Optionally, in another embodiment, a negative photoresist topography of an inverse trapezoid shape may be formed by exposure patterning definition through conventional negative photoresist, and then coating film is performed on it, and after a lift-off process is adopted to remove the photoresist, an opening with an inverse trapezoid cross-section is formed. Coating film is performed based on this structure (a coating film material may implement the same filter spectrum as an organic color filter material), and then the photoresist is removed through a lift-off process, part of the negative photoresist is lifted-off (a coating film layer on the negative photoresist is also lifted-off synchronously), leaving a coating film layer material that needs a material filter layer, so as to implement patterning of a coating film color filter layer, such that the color filter layer only covers part of holes of the light blocking layer.

Specifically, common photoresist coated on the upper surface of the light blocking layer and in the first hole array may be patterned and exposed, the exposed common photoresist is removed by development, and then coating film is performed (the coating film material may implement the same filter spectrum as the organic color filter material), and finally the remaining common photoresist and the above coating film are lifted-off together, and first color filter units covered in the part of holes of the light blocking layer are formed.

Optionally, in the embodiments of the present application, the method further includes: making second color filter units or a first transparent dielectric layer in another part of holes other than the part of first holes in the first hole array, the second color filter units being configured to transmit light of a different color from the first color filter units, and the first color filter units and the second color filter units forming a light transmitting dielectric layer or the first color filter units and the first transparent dielectric layer forming a light transmitting dielectric layer.

Optionally, a method of making the second color filter unit may refer to that of the first color filter, and for the sake of brevity, it is not be repeated here.

The first transparent dielectric layer may be made by means of coating film or coating.

Optionally, in the embodiments of the present application, the method further includes making a second transparent dielectric layer on an upper surface of the light transmitting dielectric layer; making the microlens array on an upper surface of the second transparent dielectric layer.

Optionally, the second transparent dielectric layer may also be made by means of coating film or coating.

Optionally, in the embodiments of the present application, the infrared radiation cut filter layer may also be integrated inside the fingerprint sensor chip, and the light blocking layer may be directly formed on the upper surface of the fingerprint sensor chip by means of coating film.

It should be understood that, in the method embodiments of the present application, values of sequence numbers of the above various processes do not mean an order of execution which should be determined based upon functionalities and internal logics thereof, rather than setting any limitation to implementation of the embodiment of the present application.

It should be noted that terms used in embodiments of the present application and the claims appended hereto are merely for the purpose of describing particular embodiments, and are not intended to limit the embodiments of the present application.

For example, the use of a singular form of "a", "said", "the above" and "the" in the embodiments of the present application and the claims appended hereto are also intended to include a plural form, unless otherwise clearly indicated herein by context.

It should be noted that, under a premise of no conflict, various embodiments and/or technical features in the various embodiments described in the present application may be combined with each other arbitrarily, and the technical solutions acquired after the combination should also fall within the protection scope of the present application.

The systems, devices, and methods disclosed in the embodiments of the present application may be implemented in other manners. For example, some features of method embodiments described above may be omitted or not implemented. Device embodiments described above are only illustrative, and division of units is only a logical function division. In actual implementation, there may be other division methods, and a plurality of units or components may be combined or integrated into another system. In addition, a coupling between the various units or a coupling between the various components may be a direct coupling or an indirect coupling, and the above coupling includes electrical, mechanical or other forms of connection.

It should be understood that the specific examples in the embodiments of the present application are only to help those skilled in the art to better understand the embodiments of the present application, but not to limit the scope of the embodiments of the present application. Various modifications and variations which fall within the scope of the present application can be made by those skilled in the art based on the foregoing embodiments.

The foregoing descriptions are merely specific implementation manners of the present application. However, the protection scope of the present application is not limited thereto, and those skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

The invention claimed is:

1. A fingerprint identification apparatus being applicable to an electronic device with a display screen, wherein the fingerprint identification apparatus is configured to be provided under the display screen, and the fingerprint identification apparatus comprises:
   a fingerprint sensor chip; and
   an infrared radiation cut filter layer provided above the fingerprint sensor chip;
   a light blocking layer provided on an upper surface of the infrared radiation cut filter layer by means of coating film, the light blocking layer being provided with a first hole array, and cross sections of first holes in the first hole array being inverse trapezoid;
   a light transmitting dielectric layer comprising first color filter units, the first color filter units being formed in part of the first holes in the first hole array to cover the part of the first holes, and the first color filter units being configured to transmit light of at least one waveband among red light, blue light and green light;
   a microlens array provided above the light transmitting dielectric layer;
   wherein the fingerprint sensor chip is configured to receive an optical signal returned by a finger above the display screen, converged by the microlens array, and then guided by the first hole array, and the optical signal is configured to perform fingerprint identification.

2. The fingerprint identification apparatus according to claim 1, wherein the first color filter units are formed in the part of the first holes by an organic color resist material after coating and patterning by exposure and development; or
   the first color filter units are formed in the part of the first holes by an inorganic material after coating film and patterning by means of a lift-off process.

3. The fingerprint identification apparatus according to claim 2, wherein the first color filter units are made of silicon dioxide, titanium dioxide or niobium pentoxide.

4. The fingerprint identification apparatus according to claim 1, wherein a thickness of the first color filter units is 0.5-3 μm.

5. The fingerprint identification apparatus according to claim 1, wherein the infrared radiation cut filter layer is a coating film layer formed on an upper surface of the fingerprint sensor chip.

6. The fingerprint identification apparatus according to claim 1, wherein the light transmitting dielectric layer further comprises second color filter units or a first transparent dielectric layer, the second color filter units or the first transparent dielectric layer is formed in another part of the first holes other than the part of the first holes in the first hole array to cover the another part of the first holes, and the second color filter units are configured to transmit light of a different color from the first color filter unit.

7. The fingerprint identification apparatus according to claim 6, wherein the fingerprint identification apparatus further comprises:
   a second transparent dielectric layer provided on an upper surface of the light transmitting dielectric layer;
   wherein the microlens array is provided on an upper surface of the second transparent dielectric layer.

8. The fingerprint identification apparatus according to claim 7, wherein reflectance and transmittance of a non-opening area of the light blocking layer to an optical signal in a waveband of 400 nm~1200 nm are less than 0.1%; and
   transmittance of the first transparent dielectric layer and/or the second transparent dielectric layer to an optical signal in a visible light waveband is greater than 98%.

9. The fingerprint identification apparatus according to claim 6, wherein the first color filter units are configured to transmit the red light, and the second color filter units are configured to transmit the green light.

10. The fingerprint identification apparatus according to claim 1, wherein the fingerprint sensor chip comprises a pixel array having a plurality of pixel units, the plurality of pixel units comprise effective pixel units of a photosensitive area and dark pixel units of a dark pixel area, and the dark pixel area surrounds the photosensitive area; wherein the light transmitting dielectric layer comprises a plurality of first color filter units provided above the effective pixel units of at least one circle at an outermost periphery of the photosensitive area and a plurality of first color filter units in a grid shape provided above the dark pixel units, and the plurality of first color filter units provided above the dark pixel units are connected to the plurality of first color filter units provided above the effective pixel units.

11. The fingerprint identification apparatus according to claim 10, wherein the plurality of first color filter units provided above the effective pixel units are discretely distributed; or
   the plurality of first color filter units provided above the effective pixel units are continuously distributed.

12. The fingerprint identification apparatus according to claim 1, wherein the fingerprint sensor chip comprises a pixel array having a plurality of pixel units and a metal pattern layer, and the metal pattern layer is a circuit layer inside the fingerprint sensor chip;
   wherein the metal pattern layer is provided above the pixel array, the metal pattern layer is provided with a second hole array, and second holes in the second hole array corresponds to pixel units in the pixel array one-to-one;
   wherein the pixel array is configured to receive the optical signal returned by the finger above the display screen, converged by the microlens array, and then guided by the first hole array and the second hole array.

13. The fingerprint identification apparatus according to claim 1, wherein a first hole array in the light blocking layer is formed by an etching or lift-off process after exposure and development.

14. An electronic device, comprising:
   a display screen;
   and a fingerprint identification apparatus, wherein the fingerprint identification apparatus is provided under the display screen, and the fingerprint identification apparatus comprises:
   a fingerprint sensor chip; and
   an infrared radiation cut filter layer provided above the fingerprint sensor chip;
   a light blocking layer provided on an upper surface of the infrared radiation cut filter layer by means of coating film, the light blocking layer being provided with a first hole array, and cross sections of first holes in the first hole array being inverse trapezoid;
   a light transmitting dielectric layer comprising first color filter units, the first color filter units being formed in part of the first holes in the first hole array to cover the part of the first holes, and the first color filter units being configured to transmit light of at least one waveband among red light, blue light and green light;

a microlens array provided above the light transmitting dielectric layer;

wherein the fingerprint sensor chip is configured to receive an optical signal returned by a finger above the display screen, converged by the microlens array, and then guided by the first hole array, and the optical signal is configured to perform fingerprint identification.

15. A method of preparing a fingerprint identification apparatus, comprising:

making an infrared radiation cut filter layer on an upper surface of a fingerprint sensor chip by means of coating film;

performing coating film on an upper surface of the infrared radiation cut filter layer, and performing patterning by a lift-off process to form a light blocking layer having a first hole array, and cross sections of first holes in the first hole array being inverse trapezoid;

making first color filter units in part of the first holes in the first hole array, and the first color filter units being configured to transmit light of at least one waveband among red light, blue light and green light.

16. The method according to claim 15, wherein the making the first color filter unit in the part of the first holes in the first hole array comprises:

adopting an organic color resist material to perform coating on an upper surface of the light blocking layer and in the first hole array;

performing the patterning by exposure and development, such that the organic color resist material covers the part of the first holes in the first hole array to form the first color filter units.

17. The method according to claim 15, wherein the making the first color filter unit in the part of the first holes in the first hole array comprises:

adopting an inorganic material to perform coating film on the upper surface of the light blocking layer and in the first hole array;

performing the patterning by the lift-off process, such that the organic color resist material covers the part of the first holes in the first hole array to form the first color filter units.

18. The method according to claim 15, wherein the method further comprises:

making second color filter units or a first transparent dielectric layer in another part of the first holes other than the part of the first holes in the first hole array, the second color filter units being configured to transmit light of a different color from the first color filter unit, and the first color filter units and the second color filter units forming a light transmitting dielectric layer or the first color filter unit and the first transparent dielectric layer forming a light transmitting dielectric layer.

19. The method according to claim 18, wherein the first color filter units are configured to transmit the red light, and the second color filter units are configured to transmit the green light.

20. The method according to claim 18, wherein the method further comprises:

making a second transparent dielectric layer on an upper surface of the light transmitting dielectric layer;

making a microlens array on an upper surface of the second transparent dielectric layer.

* * * * *